(12) United States Patent
Iwagami et al.

(10) Patent No.: US 10,615,708 B2
(45) Date of Patent: Apr. 7, 2020

(54) INVERTER CONTROL DEVICE

(71) Applicant: Nidec Elesys Corporation, Kawasaki-shi, Kanagawa (JP)

(72) Inventors: Naoki Iwagami, Kawasaki (JP); Hitoshi Kuroyanagi, Kawasaki (JP)

(73) Assignee: NIDEC ELESYS CORPORATION, Kanagawa (JP)

( * ) Notice: Subject to any disclaimer, the term of this patent is extended or adjusted under 35 U.S.C. 154(b) by 0 days.

(21) Appl. No.: 16/394,427

(22) Filed: Apr. 25, 2019

(65) Prior Publication Data
US 2019/0334449 A1 Oct. 31, 2019

(30) Foreign Application Priority Data
Apr. 25, 2018 (JP) .................. 2018-084583

(51) Int. Cl.
| | | |
|---|---|---|
| H02M 7/00 | (2006.01) | |
| H02K 11/33 | (2016.01) | |
| H02M 7/5387 | (2007.01) | |
| H05K 5/00 | (2006.01) | |
| H05K 7/20 | (2006.01) | |
| H05K 5/02 | (2006.01) | |
| H02K 7/116 | (2006.01) | |
| H02P 27/08 | (2006.01) | |

(52) U.S. Cl.
CPC ............ *H02M 7/003* (2013.01); *H02K 11/33* (2016.01); *H02M 7/53871* (2013.01); *H05K 5/0017* (2013.01); *H05K 5/0247* (2013.01); *H05K 7/209* (2013.01); *H05K 7/20854* (2013.01); *H02K 7/116* (2013.01); *H02P 27/08* (2013.01); *H05K 2201/1028* (2013.01); *H05K 2201/10272* (2013.01)

(58) Field of Classification Search
CPC .. H02M 7/003; H02M 7/53871; H02K 7/116; H02K 11/33; H02P 27/08; H05K 5/0017; H05K 5/0247; H05K 7/20854; H05K 7/209; H05K 2201/10272; H05K 2201/1208
See application file for complete search history.

(56) References Cited

U.S. PATENT DOCUMENTS

| | | | | |
|---|---|---|---|---|
| 2005/0018390 A1* | 1/2005 | Sanada | ................. | H05K 3/308 |
| | | | | 361/752 |
| 2009/0023345 A1* | 1/2009 | Matsumoto | ............ | H01R 13/42 |
| | | | | 439/720 |

(Continued)

FOREIGN PATENT DOCUMENTS

JP 6104347 B1 3/2017

*Primary Examiner* — Jacob R Crum
(74) *Attorney, Agent, or Firm* — Keating & Bennett

(57) ABSTRACT

An inverter control device to drive a motor includes high-voltage circuitry that receives a power supply current and a power controller that supplies a driving current to a motor. The inverter control device further includes a first input terminal on a front surface portion of a casing of the high-voltage circuitry, a second input terminal on a power module in the power controller, and a first output terminal on a front surface portion of a casing of the power controller. Out of bus bars that electrically connect the first input terminal and the second input terminal to each other, a thickness of a bus bar on the first input terminal side is thicker than a bus bar on the second input terminal side.

6 Claims, 7 Drawing Sheets

(56) References Cited

U.S. PATENT DOCUMENTS

2009/0042419 A1\* 2/2009 Palomo ............... H01R 12/585
                                                                                      439/82
2013/0294040 A1\* 11/2013 Fukumasu ............. H02M 1/44
                                                                                      361/752

\* cited by examiner

INVERTER CONTROL DEVICE

CROSS REFERENCE TO RELATED APPLICATION

The present invention claims priority under 35 U.S.C. § 119 to Japanese Application No. 2018-084583 filed on Apr. 25, 2018 the entire contents of which is incorporated herein by reference.

1. FIELD OF THE INVENTION

The present disclosure relates to a structure of an inverter control device that is an in-vehicle power conversion device.

2. BACKGROUND

Electric cars, hybrid cars, and the like in which an electric motor is a driving source have been becoming popular as environmentally friendly vehicles in recent years. In the electric cars and the like, an inverter device (power conversion device) that accelerates and decelerates a vehicle by converting DC power from a battery to AC power to be supplied to a driving motor and controlling a motor rotation speed, a driving torque, and the like is installed.

In the related art, as the power conversion device installed in the vehicle, a power conversion device is disclosed in which a power system main circuit unit, a control circuit unit, an input filter circuit unit, and the like are accommodated in a case so as to be arranged and screwed to a distal end surface of a boss portion protruding from a bottom portion of the case toward an opening portion on the upper side.

In the power conversion device of the related art, a control wire, an input wire, and an output wire composed of a bus bar made of metal are formed so as to be integrally formed with a plurality of connectors which are connected to an external interface. These connectors are fixed to a side wall of the case by a fastener at a height position corresponding to the height of the control circuit unit, the input filter circuit unit, and an output filter circuit unit.

As described above, in the power conversion device of the related art, attachment positions of the connectors are fixed in the case. Therefore, an action of changing the position of an input terminal of an external power supply, for example, in correspondence with the vehicle in which an inverter control device is installed cannot be taken. In addition, in the related art, measures for dissipating heat generated in an electrical path handling a high-voltage power supply is not taken. Therefore, there is a problem in that other sections in the device are affected by the heat generation in a high-voltage circuitry.

SUMMARY

The following configuration is included as one measure for solving the abovementioned problem. That is, an example embodiment of the present disclosure is an inverter control device to drive a motor including high-voltage circuitry that receives a power supply current and a power controller that supplies a driving current to a motor. The inverter control device further includes a first input terminal on a front surface portion of a casing of the high-voltage circuitry, a second input terminal on a power module in the power controller, and a first output terminal on a front surface portion of a casing of the power controller. Out of bus bars that electrically connect the first input terminal and the second input terminal to each other, a thickness of a bus bar on the first input terminal side is thicker than a bus bar on the second input terminal side.

The above and other elements, features, steps, characteristics and advantages of the present disclosure will become more apparent from the following detailed description of the example embodiments with reference to the attached drawings.

DETAILED DESCRIPTION

Figure 1:
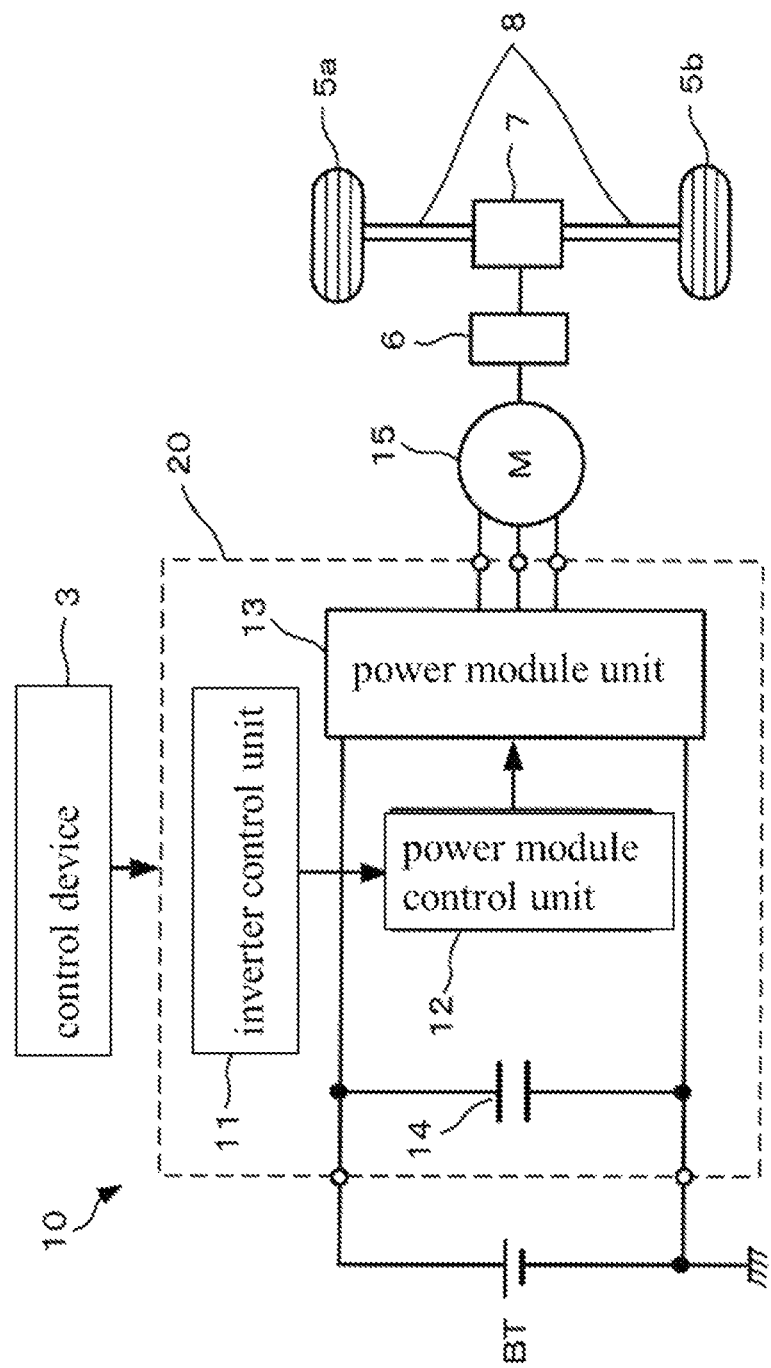
FIG. 1 is a schematic configuration of a vehicle in which an inverter control device according to an example embodiment of the present disclosure is installed.

Example embodiments according to the present disclosure are described below in detail with reference to the accompanying drawings. FIG. 1 is a schematic configuration of a vehicle in which an inverter control device according to an example embodiment of the present disclosure is installed. In FIG. 1, an electric motor 15 is a three-phase AC motor, for example, and is a driving force source of the vehicle. A rotation shaft of the electric motor 15 is connected to a reducer 6 and a differential gear 7, and a driving force (torque) of the electric motor 15 is transmitted to a pair of wheels 5a and 5b via the reducer 6, the differential gear 7, and a drive shaft (driving shaft) 8.

An inverter unit 20 of an inverter control device 10 includes a power module unit 13 that supplies driving power to the electric motor 15, a power module control unit 12 that outputs a driving signal to the power module unit 13, an inverter control unit 11 that outputs a control signal to the power module control unit 12, and a smoothing capacitor 14. The inverter unit 20 is controlled by a control signal from a control device 3 that is responsible for the control of the entire vehicle.

The power module unit 13 includes a bridge circuit (power conversion circuit) obtained by connecting two power switching elements (an upper-arm power switching element and a lower-arm power switching element) such as Insulated Gate Bipolar Transistors (IGBTs) and Metal Oxide Semiconductor Field Effect Transistors (MOSFETs) for each of a U-phase, a V-phase, and a W-phase, that is, a total of six power switching elements.

The power module unit 13 converts DC power from a battery BT to AC power (three-phase AC power) by switching the ON/OFF of the power switching elements by a driving signal (PWM control signal) from the power module control unit 12, and drives the electric motor 15 by the conversion.

The battery (BT) is a supply source of electrical energy that is a power source of the vehicle, and is formed by a plurality of secondary batteries, for example. The capacitor 14 is arranged in the inverter unit 20 at a part connected to the battery (BT). The capacitor 14 is connected between a high-potential line (positive-electrode potential B+) and a low-potential line (negative-electrode potential B-(GND)), and is a high-capacity smoothing capacitor (film capacitor) that smooths the input voltage from the battery BT.

Figure 2:
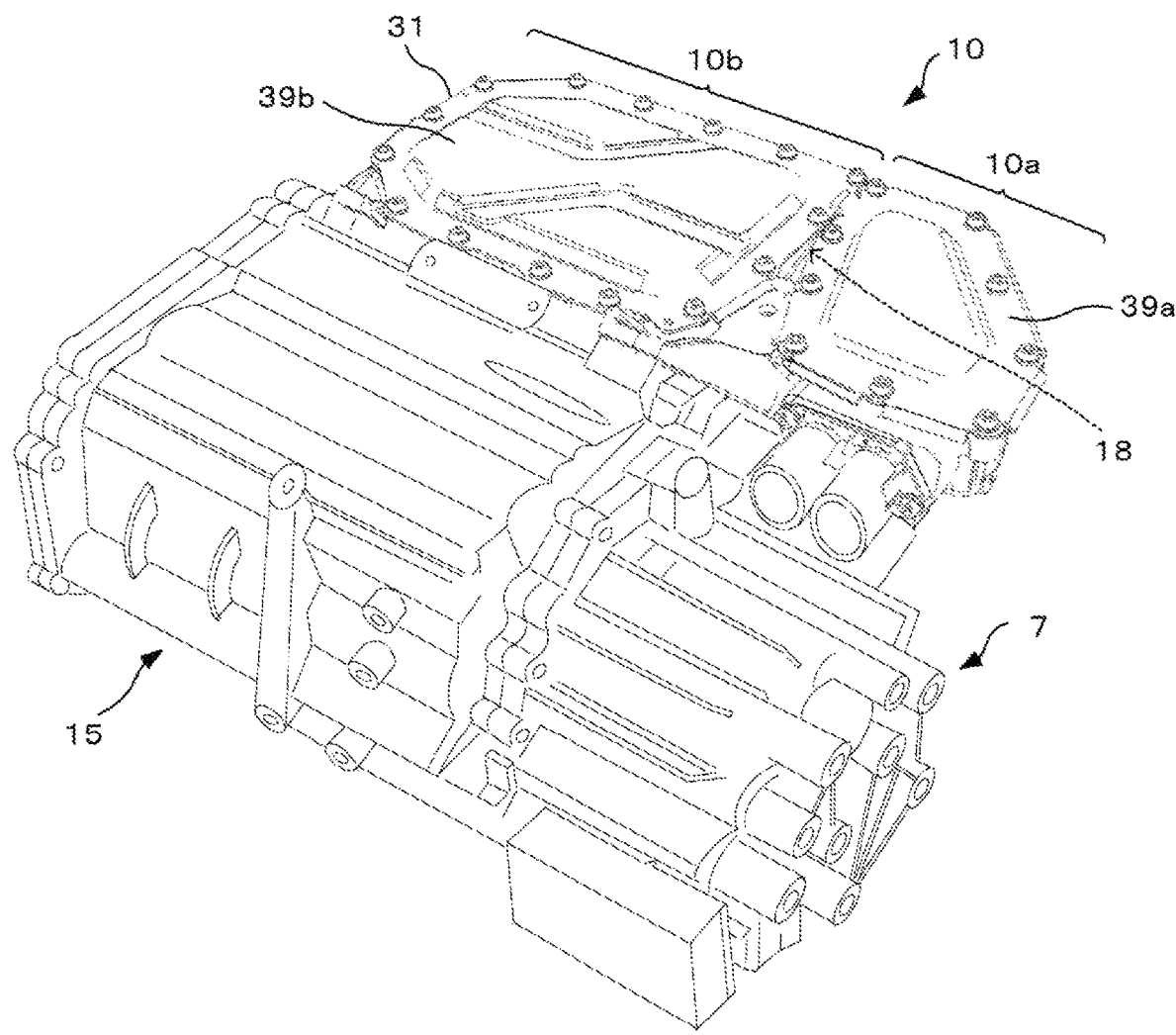
FIG. 2 is an external view of the inverter control device in which a driving motor and a gear are combined and integrated.

The structure of the inverter control device according to this example embodiment is described. FIG. 2 is an external view of the inverter control device 10, and illustrates a state in which the inverter control device 10, the electric motor 15, and the gear 7 are combined and integrated. A casing 31 of the inverter control device 10 is obtained by molding an aluminum die casting, for example. The inverter control device 10 includes a high-voltage circuitry 10a that is an input unit for high-voltage current from an external battery (the battery (BT) in FIG. 1), and a power controller 10b that supplies driving current to a driving motor.

The high-voltage circuitry 10a and the power controller 10b are separated from each other via a partition wall 18 in the casing 31. Upper surface portions of the high-voltage circuitry 10a and the power controller 10b are covered with covers 39a and 39b that are flat-plate-like members made of metal such as aluminum, for example.

Figure 8:
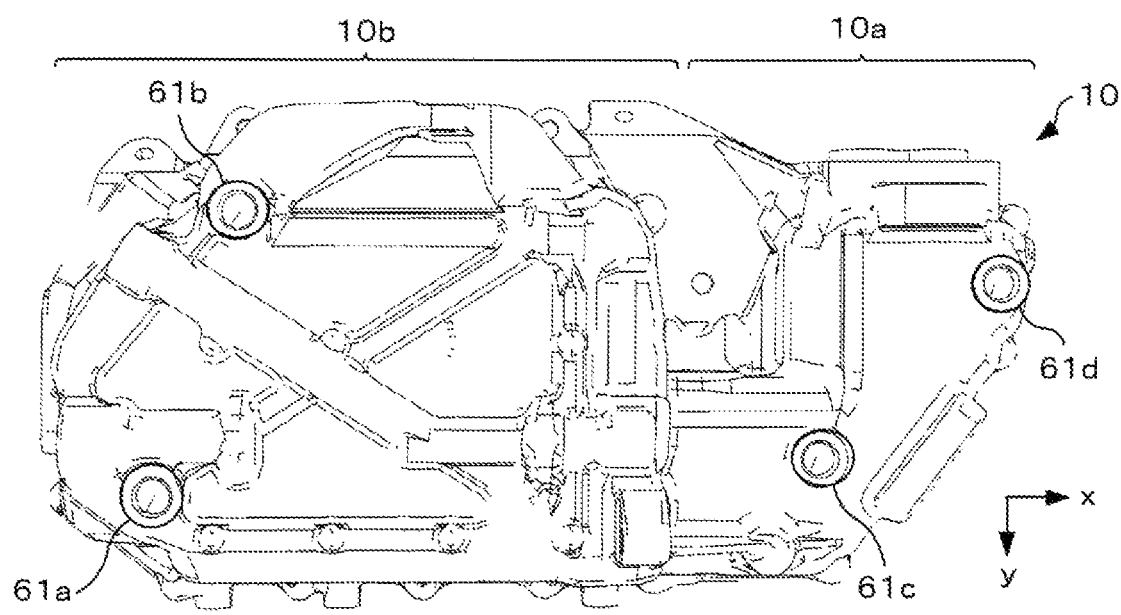
FIG. 8 is a view illustrating a plurality of recessed portions provided in predetermined positions in an external bottom surface portion of a casing.

Note that, as illustrated in FIG. 8, a plurality of recessed portions (recessed portions 61a to 61c) are provided in predetermined positions in an external bottom surface portion of the casing of the high-voltage circuitry 10a of the inverter control device 10 and an external bottom surface portion of the casing of the power controller 10b. With those recessed portions, the positioning of the inverter control device in a production facility and a production line becomes easier and the work efficiency is improved.

Figure 3:
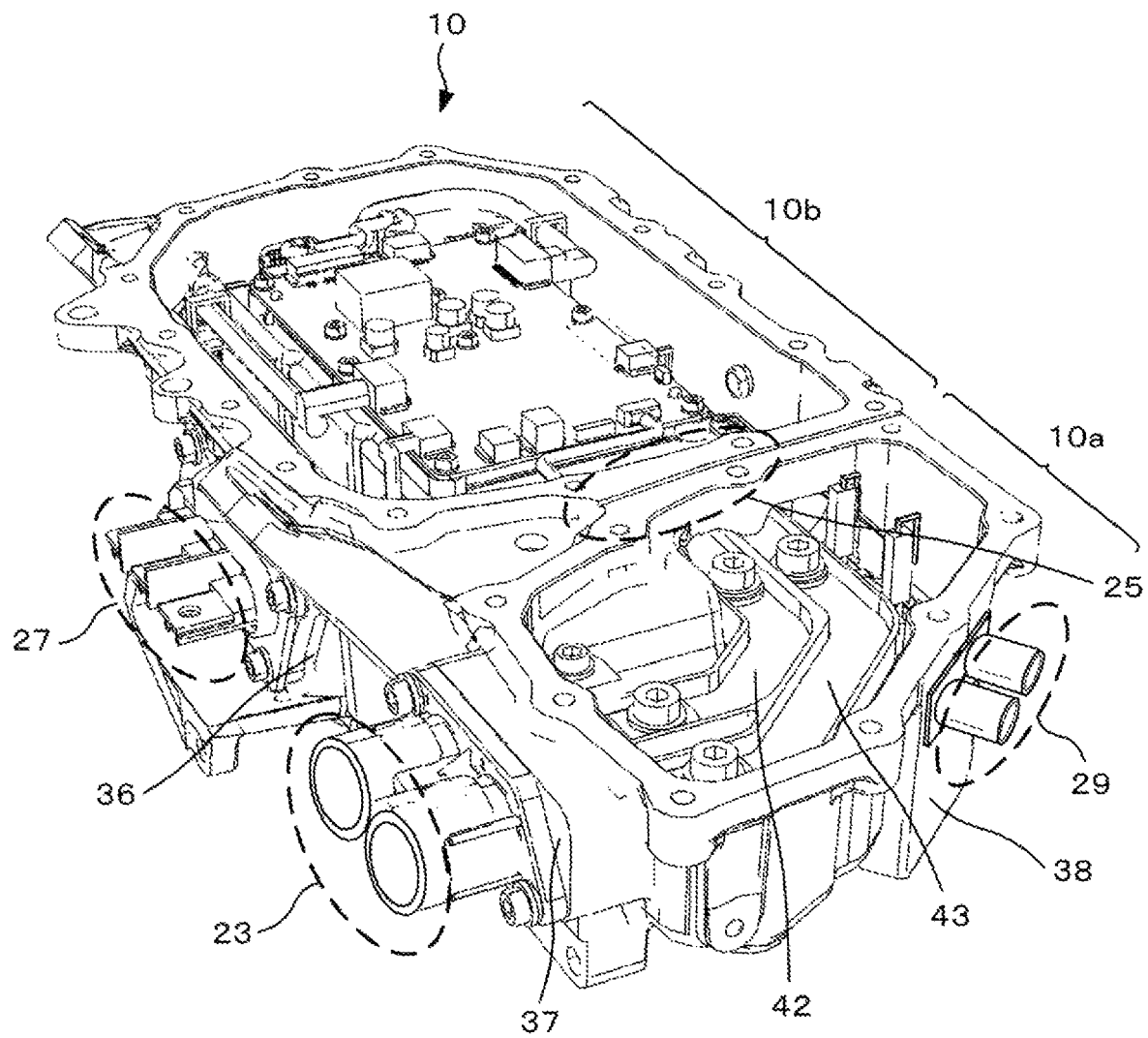
FIG. 3 is a perspective view illustrating the arrangement of electrical connection parts (connector terminals) in the inverter control device.

FIG. 3 is a perspective view illustrating the arrangement of connector terminals that are electrical connection parts in the inverter control device 10. The high-voltage circuitry 10a of the inverter control device 10 includes an external power supply input terminal 23 and an additional terminal 29. The external power supply input terminal 23 is arranged on a front surface portion 37 of the casing of the high-voltage circuitry 10a, and a high-voltage current is input to the external power supply input terminal 23 by connecting the external power supply input terminal 23 to an external power supply (battery). The additional terminal 29 is arranged on a side surface portion 38 of the casing.

The power controller 10b of the inverter control device 10 includes a power controller input terminal 25 that receives a high-voltage current input from the external power supply input terminal 23 of the high-voltage circuitry 10a via a pair of bus bars 42 and 43 provided in the high-voltage circuitry 10a, and an output terminal 27, which supplies a power supply current to the driving motor and is arranged on a front surface portion 36 of the casing of the power controller 10b.

Figure 4:
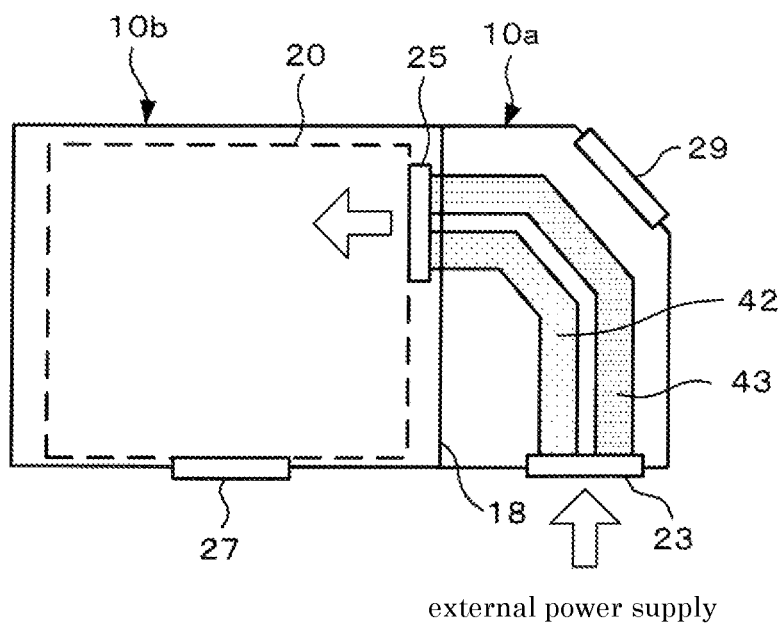
FIG. 4 is a view schematically illustrating each connector terminal and a power supplying path corresponding to FIG. 3.
Figure 5A:
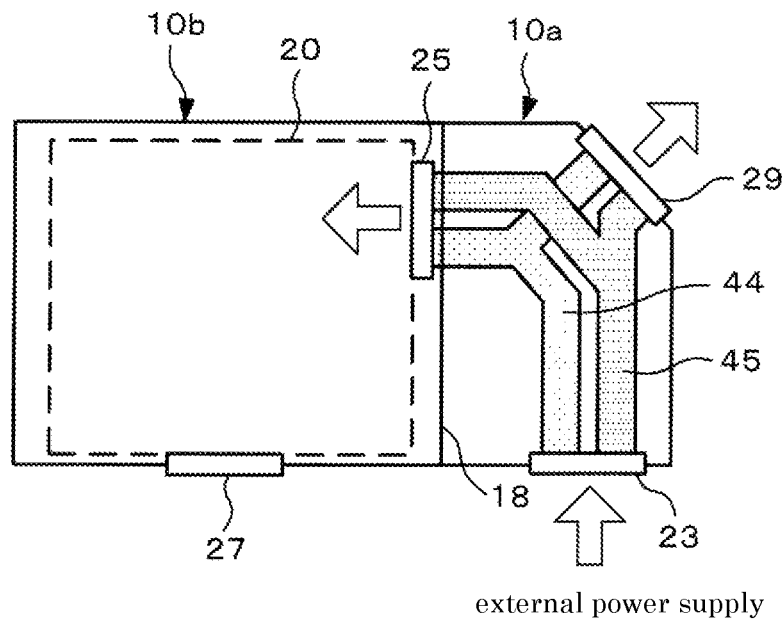
FIG. 5A is a view illustrating an example in which an additional terminal of a high-voltage circuitry is used as a power supply output terminal.
Figure 5B:
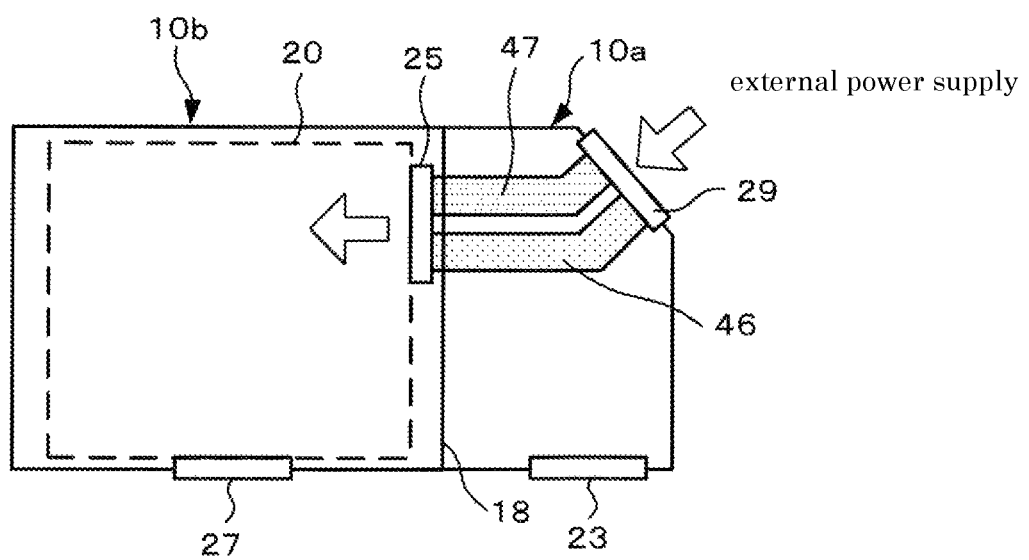
FIG. 5B is a view illustrating an example in which the additional terminal is used as an input terminal of an external power supply.

FIG. 4, FIG. 5A, and FIG. 5B are views for describing each connector terminal and the power supplying path described above in the inverter control device 10. FIG. 4 schematically illustrates each connector terminal and the power supplying path corresponding to FIG. 3. That is, the external power supply input terminal 23 and the power controller input terminal 25 are electrically connected to each other via the bus bars 42 and 43.

The bus bars 42 and 43 pass through the partition wall 18 between the high-voltage circuitry 10a and the power controller 10b and terminate at the power controller input terminal 25 arranged in the inverter unit 20. In addition, FIG. 4 illustrates a state in which there is no electrical connection at the additional terminal 29 of the high-voltage circuitry 10a. When the additional terminal 29 is formed, the same mold as that for the external power supply input terminal 23 can be used.

FIG. 5A illustrates an example in which the additional terminal 29 of the high-voltage circuitry 10a is used as the power supply output terminal. Here, branches are provided in a pair of bus bars 44 and 45, and the bus bars 44 and 45 are not only connected between the external power supply input terminal 23 and the power controller input terminal 25 but also are connected to the additional terminal 29. By the configuration as above, the high-voltage current from the external power supply connected to the external power supply input terminal 23 can be transmitted to both of the power controller input terminal 25 and the additional terminal 29.

Therefore, according to the configuration illustrated in FIG. 5A, the additional terminal 29 functions as a second connector in the high-voltage circuitry 10a, and the additional terminal 29 can be used as a terminal for supplying power supply to other devices. Therefore, the supply destination, the usage, and the like of the external power supply connected to the inverter control device 10 can be expanded without separately preparing a power supply terminal.

FIG. 5B illustrates an example in which the additional terminal 29 is used as the input terminal of the external power supply. That is, by arranging a pair of bus bars 46 and 47 between the additional terminal 29 and the power controller input terminal 25, the additional terminal 29 can be used as an alternative terminal of the external power supply input terminal 23. In addition, the position of the input terminal of the external power supply can be changed from the external power supply input terminal 23 to the additional terminal 29 in correspondence with the specification change of the vehicle in which the inverter control device 10 is installed.

Figure 6:
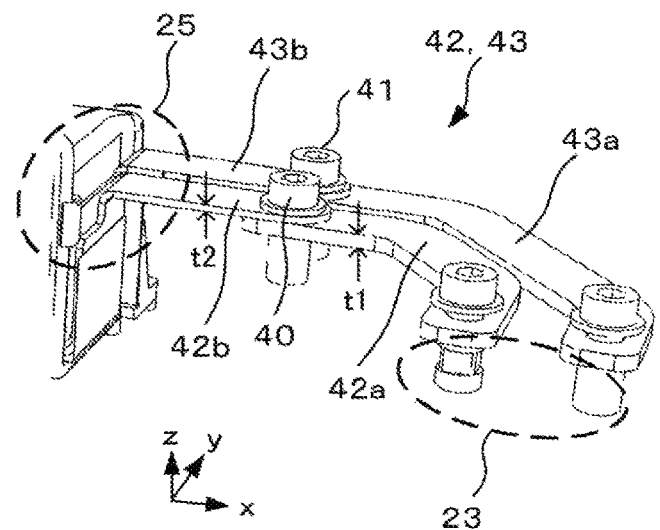
FIG. 6 is a view illustrating the configuration of bus bars provided in the high-voltage circuitry of the inverter control device.

FIG. 6 illustrates the configuration of the bus bars 42 and 43 provided in the high-voltage circuitry 10a of the inverter control device 10. As illustrated in FIG. 6, the bus bar 42 includes a bus bar 42a located on the external power supply input terminal 23 side and a bus bar 42b located on the power controller input terminal 25 side, and one end portion of the bus bar 42a and one end portion of the bus bar 42b are connected to each other by a relay screw 40.

Similarly, the bus bar 43 includes a bus bar 43a located on the external power supply input terminal 23 side and a bus bar 43b located on the power controller input terminal 25 side, and one end portion of the bus bar 43a and one end portion of the bus bar 43b are connected to each other by a relay screw 41.

A thickness t1 of the bus bar 42a is formed to be thicker than a thickness t2 of the bus bar 42b (t1>t2). The same can be said to the thickness of the bus bar 43a and the bus bar 43b. As a result, the heat generated at the bus bar by a high-voltage large current in the high-voltage circuitry 10a can be efficiently dissipated to the bus bars 42a and 43a on the external power supply input terminal 23 side that are separated from the partition wall 18 and have a larger heat capacity. As a result, the influence of the heat generated in the high-voltage circuitry 10*a* on the inverter unit 20 in the power controller 10*b* can be avoided.

Figure 7:
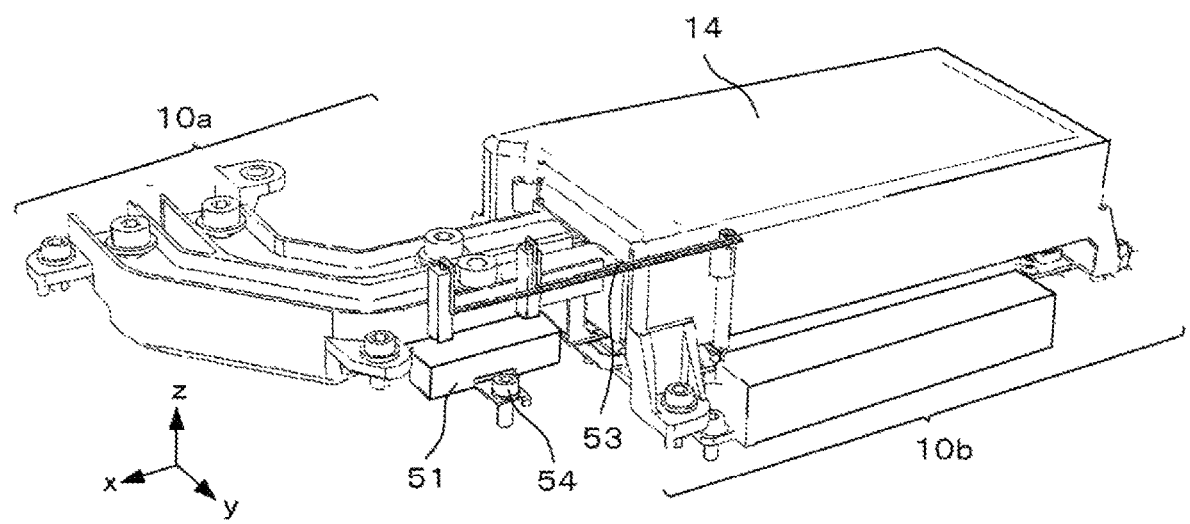
FIG. 7 is a view illustrating a configuration of charge emission from a capacitor in the inverter control device.

FIG. 7 illustrates a configuration of charge emission from the capacitor in the inverter control device. As illustrated in FIG. 7, a resistor 51 for charge emission electrically connected to the capacitor 14 via a wire harness 53 is arranged in the casing of the high-voltage circuitry 10*a*.

When the charge in the capacitor 14 is emitted to the resistor 51 for charge emission, the resistor 51 for charge emission generates heat, but the resistor 51 for charge emission is formed so as to be able to transmit heat by being fixed to the casing of the high-voltage circuitry 10*a* with a screw 54. Therefore, the heat generated by the resistor 51 for charge emission is dissipated to the casing of the high-voltage circuitry 10*a*. As a result, at the time of maintenance and inspection of the inverter control device 10, for example, the charge emission from the capacitor 14 becomes easier, and the safety of the maintenance and inspection works can be ensured.

As described above, the inverter control device according to this example embodiment has a configuration in which a first input terminal is arranged on the front surface portion of the casing of the high-voltage circuitry that receives a power supply current, a second input terminal is arranged on a power module in the power controller that supplies a driving current to the motor, a first output terminal is arranged on the front surface portion of the casing of the power controller, and the additional terminal is arranged on the side surface portion of the casing of the high-voltage circuitry.

Such configuration can provide for an aspect in which the high-voltage current from the external power supply connected to the first input terminal serving as the external power supply input terminal is transmitted to both of the additional terminal and the second input terminal serving as the power controller input terminal, and an aspect in which the additional terminal functions as the second connector in the high-voltage circuitry, that is, the additional terminal is used as the alternative terminal of the first input terminal and also used as the power supplying terminal for other devices.

In addition, out of the bus bars that electrically connect the first input terminal and the second input terminal to each other, by forming the thickness of the bus bar on the first input terminal side to be thicker than the bus bar on the second input terminal side, the heat generated at the bus bar of the high-voltage circuitry operating with a high-voltage large current can be efficiently dissipated to the bus bar on the first input terminal (external power supply input terminal) side having a larger heat capacity than the second input terminal side.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inverter control device to drive a motor, the inverter control device comprising:
   high-voltage circuitry that receives a power supply current;
   a power controller that supplies a driving current to a motor;
   a first input terminal on a front surface portion of a casing of the high-voltage circuitry;
   a second input terminal on a power module in the power controller; and
   a first output terminal on a front surface portion of a casing of the power controller; wherein
   out of bus bars that electrically connect the first input terminal and the second input terminal to each other, a thickness of one of the bus bars on the first input terminal side is thicker than another of the bus bars on the second input terminal side.

2. The inverter control device according to claim 1, wherein
   an additional terminal is on a side surface portion of the casing of the high-voltage circuitry; and
   a bus bar that electrically connects the additional terminal and the second input terminal to each other is provided.

3. The inverter control device according to claim 2, wherein
   the additional terminal is a second output terminal; and
   a power supply current input from the first input terminal is distributed to the second input terminal and the additional terminal.

4. The inverter control device according to claim 2, wherein
   the additional terminal is a third input terminal; and
   a power supply current input from the additional terminal is transmitted to the second input terminal.

5. The inverter control device according to claim 1, wherein
   a resistor used in charge emission of a capacitor mounted in the casing of the power controller is in the casing of the high-voltage circuitry; and
   heat generated by the resistor is dissipated to the casing of the high-voltage circuitry.

6. The inverter control device according to claim 1, wherein
   a plurality of recessed portions are provided in predetermined positions in an external bottom surface portion of the casing of the high-voltage circuitry and an external bottom surface portion of the casing of the power controller.

* * * * *